(12) United States Patent
Abbott (10) Patent No.: US 7,368,807 B2
(45) Date of Patent: May 6, 2008

(54) LOW COST METHOD TO PRODUCE HIGH VOLUME LEAD FRAMES

(75) Inventor: Donald C Abbott, Chartley, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/679,007

(22) Filed: Feb. 26, 2007

(65) Prior Publication Data

US 2007/0164405 A1 Jul. 19, 2007

Related U.S. Application Data

(63) Continuation of application No. 11/060,829, filed on Feb. 18, 2005, now Pat. No. 7,192,809.

(51) Int. Cl.
*H01L 23/495* (2006.01)
*H01L 21/50* (2006.01)
*H01L 21/48* (2006.01)
*H01L 21/44* (2006.01)

(52) U.S. Cl. .......... 257/676; 257/666; 257/670; 257/677; 257/E23.031; 257/E23.05; 257/E23.043; 257/E23.054; 438/123

(58) Field of Classification Search ............ 257/676, 257/666, 670, 677, E23.031, E23.05, E23.043, 257/E23.054; 438/123
See application file for complete search history.

(56) References Cited

U.S. PATENT DOCUMENTS

| | | | |
|---|---|---|---|
| 4,942,455 A * | 7/1990 | Shinohara | 257/666 |
| 5,633,528 A | 5/1997 | Abbott et al. | |
| 6,087,714 A | 7/2000 | Kubara et al. | |
| 6,150,712 A * | 11/2000 | Himeno et al. | 257/677 |
| 6,395,583 B1 | 5/2002 | Kubara et al. | |
| 6,646,330 B2 | 11/2003 | Kubara et al. | |
| 6,677,056 B2 | 1/2004 | Tanaka et al. | |
| 6,828,660 B2 | 12/2004 | Abbott | |
| 7,087,461 B2 * | 8/2006 | Park et al. | 438/112 |
| 7,190,057 B2 * | 3/2007 | Seki et al. | 257/678 |

* cited by examiner

*Primary Examiner*—Luan Thai
(74) *Attorney, Agent, or Firm*—Yingshen Tung; Wade James Brady, III; Frederick J. Telecky, Jr.

(57) ABSTRACT

A method (300) for fabricating a lead frame (100), comprising forming a plurality of external leads (122) in a lead frame material (108), plating a metal (222) on all surfaces of the lead frame material (108), and subsequently forming a plurality of internal leads (124) in the lead frame material (108). The lead frame material (108) may comprise of a portion of a contiguous metal sheeting (204) rolled upon a first coil (202), wherein the contiguous metal sheeting (204) is fed into an external lead stamping apparatus (206), thus forming the external leads (122), and rolled onto a second coil (215). The portion is fed into a plating apparatus and plated with the metal (222), and rolled onto a third coil (218) prior to forming the plurality of internal leads (124). The third coil (218) can be unrolled into an internal lead stamping apparatus (226), thus forming the internal leads (124) of a lead frame (100). The lead frame (100) is cleaned and subsequently rolled onto a fourth coil (238) to be cut into sheets (240).

18 Claims, 7 Drawing Sheets

LOW COST METHOD TO PRODUCE HIGH VOLUME LEAD FRAMES

This is a continuation application of application Ser. No. 11/060,829 filed Feb. 18, 2005, now U.S. Pat. No. 7,192,809, the contents of which are herein incorporated by reference in its entirety.

FIELD OF THE INVENTION

The present invention relates generally to semiconductor devices and processes, and more particularly to a method for fabricating lead frames for integrated circuit devices.

BACKGROUND OF THE INVENTION

In the semiconductor industry, lead frames are typically provided for semiconductor devices in order to provide a stable support pad for firmly positioning a chip within a package, and to electrically connect the chip (e.g., an integrated circuit or IC) to various other components via a circuit board. The lead frame is typically comprised of an electrically conductive material (e.g., a metal), wherein each lead frame may be comprised of a plurality of electrically conductive segments such as internal leads, external leads, tie bars, and a die (chip) pad. The die pad is centrally located on the lead frame and provides a surface on which the chip may be mounted. Lead frames typically vary in size, wherein the size of the lead frame is commonly dependent upon one or more of the size of the chip and the number of connections that are made to the chip.

Internal leads are electrically conductive segments of the lead frame that are brought into close proximity to contact pads associated with a surface of the chip. External leads are also electrically conductive segments that are generally remote from the IC chip, are operable to electrically and/or mechanically connect the internal leads and chip to external circuitry, such as in an assembly of a printed circuit board (PCB). During packaging, the die pad of typical lead frames is downset, and the chip is mounted to the die pad. A gap is typically provided between an inner tip of each of the internal leads and the chip, wherein the gap is bridged by a thin metallic connecting wire, therein electrically connecting each internal lead of the lead frame to a respective contact pad of the chip. The die pad, chip, internal leads, and associated connections are subsequently encapsulated in an encapsulating material, and excess lead frame material, such as carrier rails for the lead frame, may then be trimmed away. For example, the dam bar provides a dam or "stop" for the encapsulation material during encapsulation, and further generally connects the external leads to one another. Once the chip is encapsulated, the dam bar is trimmed away so that a plurality of individual electrically conductive paths are generally defined from the chip through each respective wire, internal lead, and external lead, and wherein the electrically conductive paths are further electrically isolated from one another.

Figure 1A:
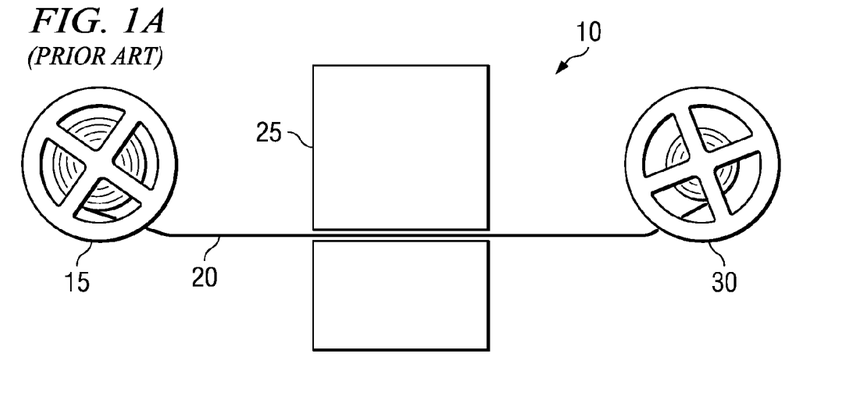
FIGS. 1A-1C are schematic representations of conventional methods for forming lead frames.
Figure 1B:
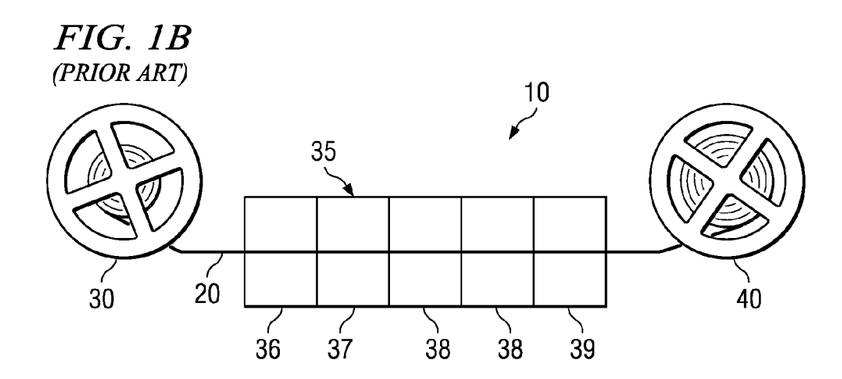
Figure 1C:
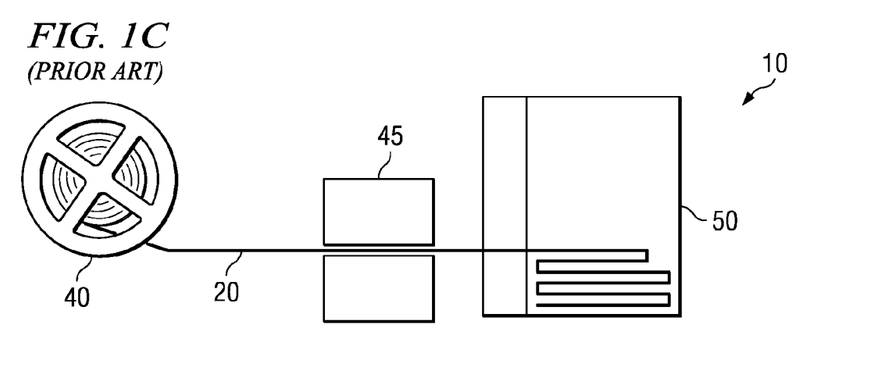

It has been common practice to manufacture lead frames from thin (about 120 to 250 µm) sheets of metal, wherein the lead frames may be manufactured in long strips of many individual units. The long strips may be wide enough to accommodate from one to more than five lead frames. When a strip is more than one lead frame wide, the strip is referred to as a matrix. A lead frame may be further equipped with carrier rails and guide holes to position the lead frames during manufacture and subsequent IC assembly. In one common example, lead frames are stamped from a continuous sheet of metal, such as a roll or reel of metal, as illustrated in the lead frame forming apparatus 10 of FIG. 1A. As illustrated, a first reel 15 of thin metal 20 is unwound and the thin metal fed into a progressive stamping tool 25, wherein the structures (not shown) of each lead frame are formed. Typically, the structures of each lead frame are formed in a single stamping tool, wherein internal leads, external leads, dam bars, tie bars, a die pad, index holes, and carrier rails are formed in the thin metal 20. Such a formation generally involves a progressive stamping tool with a plurality of individual dies (not shown) specifically operable to sequentially punch out each of the respective structures. After the sheet of thin metal 20 emerges from the progressive stamping tool 25, it is typically coiled onto a second reel 30. The second reel 30 of the stamped thin metal is then typically plated with another metal (not shown) in a separate plating apparatus 35, as illustrated in FIG. 1B, wherein the thin sheet of metal 20 is unwound from the second reel and passed through a cleaning station 36, activation station 37, one or more metal plating baths 38, and finally, a rinse and dry station 39. The sheet of thin metal 20 is subsequently rolled onto a third reel 40. Once the plated thin metal 20 (comprising the stamped and plated lead frame structures) is wound upon the third reel 40, the third reel is brought to a cut and downset apparatus 45, as illustrated in FIG. 1C. The thin metal 20 is then unwound from the third reel 40 and passed through the cut and downset apparatus 45, wherein the stamped and plated lead frames (not shown) are cut into sheets 50, and wherein the die pad of each lead frame is down set.

The desired shape of the lead frame is typically stamped from the original sheet in a single stamping process using a single stamping tool (e.g., the progressive stamping tool 25 of FIG. 1A), wherein the entire lead frame, including the internal leads and external leads, is generally defined in the single stamping process. In this manner, each individual segment of the lead frame (for both internal and external leads) takes the form of a thin metallic strip with its particular geometric shape determined by design. For most purposes, the length of a typical segment is considerably longer than its width. Internal leads are also significantly narrower than external leads, for purposes of providing each internal lead as close to the IC chip as possible given the small size of the chip. As a consequence, the punches (not shown) of the progressive stamping tool 25 utilized in forming the internal leads are typically smaller and much more delicate than the punches utilized for forming the external leads and the index (pilot) holes. Thus, the internal lead and die pad punches typically wear faster and fail more frequently than the external lead punches. Any such failure or wearing of the punches in the progressive stamping tool 25 typically leads to the stamping operation being halted for maintenance, therein reducing uptime, lowering output, and reducing tool life caused by more frequent sharpening.

Lead frames also typically provide a framework for encapsulating the sensitive IC chip and the fragile connecting wires. Encapsulation using plastic materials, rather than metal cans or ceramic, has been the preferred method because of the relatively low cost associated with the plastic materials. Reliability tests in moist environments have shown, however, that the molding compound should have good adhesion to the lead frame and the encapsulated components in order to provide reliable devices. Two major contributors to good adhesion are the chemical affinity of the molding compound to the metal of the lead frame and the surface roughness of the lead frame. Thus, plating or not plating of the original metal lead frame with an appropriate metal can effectuate good adhesion of the encapsulation compound to the lead frame, thus improving the reliability of the lead frame. Therefore, in the conventional lead frame forming apparatus 10 of FIGS. 1A-1C, once the entire lead frame has been stamped, the sheet(s) of thin metal 20 are typically plated with another metal in the plating apparatus 35 to produce a clean, non-reactive finish suitable for wire bonding on the internal leads and for soldering of the external leads after the IC is assembled. Such plating is typically performed after all structures (not shown) of the lead frame are formed, but prior to cutting and down-setting of the die pad.

Furthermore, in order to provide good adhesion for most molding compounds, as well as good electrical connections to the internal leads for wire bonding and good solderability to the external leads after encapsulation, typical lead frames are coated with multiple layers of nickel, palladium and gold, which exhibit good adhesion and conductive properties. However, it is well recognized that mold compounds show superior adhesion to copper than to nickel, palladium or gold. Due to cost considerations, however, use of noble metals in semiconductor manufacturing is closely monitored. As stated above, conventional lead frames are typically plated after both internal and external leads are formed, therein plating a substantially large surface area (e.g., plating the thickness of the sheet of metal for each punched-out area). Plating of such a large surface area can have a substantial impact on the cost of the semiconductor device, since the overall surface area of the lead frame can be quite large.

Because of the many sizes of chips or dies, there are also currently many different sizes and configurations of lead frames, such as quad flat pack or dual-in-line configurations. Complicated lead frame configurations may be further made by even more expensive progressive stamping tools. Typically, each stamping tool is utilized to form a distinct lead frame configuration, thus requiring a plurality of stamping tools for a respective plurality of lead frame configurations. Progressive stamping tools for leadframe typically cost hundreds of thousands of dollars and can take many months to build. Preparation and maintenance of stamping tools and processes for manufacturing lead frames may also result in increased lead frame costs, as well as extended cycle time from demand through development to production. Furthermore, these costs and delays typically recur with each new lead frame design.

Therefore, a need currently exists for a low cost and reliable process for manufacturing lead frames, wherein both the lead frame and its method of fabrication can be applied to different semiconductor product families. The lead frame and method should be flexible to provide a wide spectrum of design and assembly variations and should achieve improvements toward the goals of improved process yields and device reliability.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward an improved method for fabricating a lead frame structure, wherein reliability of the resultant lead frame is improved while also limiting costs associated with the fabrication of the lead frame. The method of the present invention comprises forming a plurality of external leads in a sheet of metal, and subsequently plating the sheet of metal with one or more metals. After the sheet of metal is plated, a plurality of internal leads and a die pad are formed in the sheet of metal. Once the internal leads and die pad are formed, the die pad is subsequently downset and a finished lead frame is generally defined.

In accordance with one exemplary aspect of the present invention, a sheet of contiguous metal is provided from a first coil to an external lead stamping apparatus, such as a first press and progressive stamping tool. The external lead stamping apparatus is operable to form the plurality of external leads on the sheet of contiguous metal, wherein punches associated with the external lead stamping apparatus are generally large and robust. Such an external lead stamping apparatus, for example, may be located in a low-labor cost area, since the large and robust punches generally require less skill and labor to operate and maintain. The stamped sheet of metal then defines a "lead frame blank", wherein internal leads, die pads, and tie bars have not yet been defined, and the stamped sheet of metal is rolled onto a second coil.

After the external leads are formed, the sheet of contiguous metal is unrolled from the second coil and plated, thus plating all surfaces of the sheet of metal. Once the sheet of metal is plated, the sheet may again be rolled onto a third coil for storage or transportation. Since the external leads are generally generic to a plurality of different IC devices or packages (e.g., external lead spacing, shapes and forms defined by industry standards wherein several differing IC chips can utilize the same external lead design, while having differing internal lead designs), cost savings can be realized, since a generic base product, or "plated lead frame blank", is produced.

According to another exemplary aspect of the invention, the plated third coil is provided to an internal lead stamping apparatus, such as a second press and progressive stamping tool, wherein the internal lead stamping apparatus is operable to form one or more internal leads, a die pad, and tie bars in an interior region of the plated lead frame blank. After the sheet of metal is stamped in the internal lead stamping apparatus, a plurality of lead frames are generally defined. The lead frames are generally cleaned of stamping oils after the internal leads are formed, and the sheet of metal can be rolled onto a fourth coil. The fourth coil may then be stored or transported to another location, wherein the fourth coil is unrolled and the die pads may be down-set for the accommodation of an IC chip. Individual lead frames may be further cut and separated from one another, wherein the plurality of lead frames are generally ready for use by an end user of the lead frames. In one example, the internal lead stamping apparatus can be located in a higher cost region than the location of the external lead stamping apparatus, since it may require higher skilled labor to operate and maintain finer and more delicate punches associated therewith. For example, the internal lead stamping apparatus may be located near the end user of the lead frame, such as an assembly/test house.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed towards a method for fabricating a lead frame for an integrated circuit device. More particularly, the present invention provides a cost-effective two-stage stamping process for fabricating both generic and customized lead frame structures. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
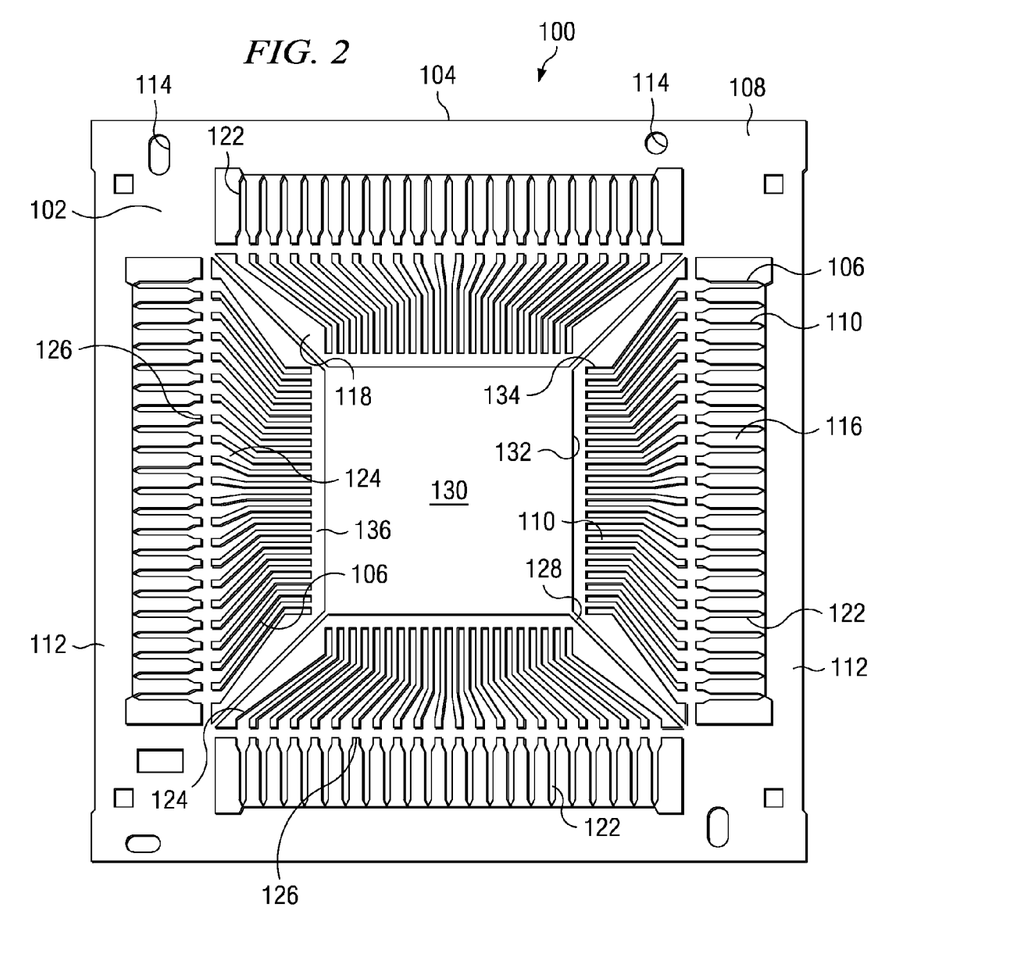
FIG. 2 is a plan view of an exemplary lead frame base in accordance with one aspect of the present invention.

The present invention provides a lead frame for the formation of an integrated circuit (IC) package. Accordingly, the lead frame is operable to support and electrically connect an IC device, such as a semiconductor IC chip, to a variety of other devices, such as a printed circuit board (PCB) or other circuitry. Referring now to the figures, FIG. 2 illustrates an plan view of an exemplary lead frame 100 (also referred to as a "lead frame base") in accordance with one aspect of the present invention. It should be noted that design of the lead frame 100 may vary significantly from that of FIG. 2, and that the illustrated lead frame is just one example. The lead frame 100 of FIG. 2, for example, is comprised of a base material 102 that generally takes the form of a sheet 104. The sheet 104 of base material 102, for example, ranges in thickness between approximately 100 and 300 μm, however, thicker or thinner sheets are possible. Suitable base materials 102, for example, may include copper, iron, nickel, aluminum, or alloys containing such metals. Preferably, the base material 102 is sufficiently ductile to allow a formation of structures 106 in the lead frame 100 via a stamping or etching process, as will be discussed infra.

The one or more structures 106 if the lead frame 100 comprise one or more carrier rails 108, a plurality of electrically conductive leads 110, and one or more cross rails 112. The carrier rails 108 and/or cross rails 112 may further comprise one or more index holes 114 or other features that can be utilized to determine and/or maintain a position of the lead frame base 100. For example, the index holes 114 are operable to position the lead frame base 100 through one or more stamping and plating processes, wherein the lead frame base is precisely positioned via the index holes.

The lead frame 100 comprises an external lead frame portion 116 and an internal lead frame portion 118, wherein the plurality of electrically conductive leads 110, for example, comprise a plurality of external leads 122 associated with the external lead frame portion, and a plurality of internal leads 124 associated with the internal lead frame portion. The plurality of external leads 122 are generally separated from the plurality of internal leads 124 by a dam bar 126, wherein the dam bar substantially supports the plurality of external leads and internal leads between the carrier rails 108 and the cross rails 112. The lead frame 100 further comprises a plurality of tie bar portions 128, wherein the plurality of tie bar portions, for example, generally extend from the carrier rails 108 to support a die pad 130 in a die pad region 132. The die pad 130, for example, is further associated with an integrated circuit (IC) device (not shown) such as a semiconductor IC chip, wherein the die pad can take the form of a variety of shapes, such as a rectangular die pad, or any other shape or design, such as a cross, grid, or the like. All such shapes and designs of the die pad 130 are therefore contemplated as falling within the scope of the present invention.

In the present example, the plurality of leads 110 are generally arrayed on four sides of the lead frame 100, wherein tips 134 of the plurality of internal leads 124 are associated with a size and shape of the die pad region 132 and/or the die pad 130. The tips 134 of the plurality of internal leads 124, for example, are positioned a minimal distance 136 away from IC device (not shown), such that a minimal length of wire bonds (not shown) are needed to bond and electrically connect the IC device to the respective tips of the internal leads.

In the present example, the plurality of leads 110 of the lead frame base 100 are configured for use with a quad flat pack (QFP) IC device. However, the plurality of leads 110 may be arrayed for use other IC device configurations, such as SOIC, TVSOP, and TSSOP, PDIP and others, and all such configurations are contemplated as falling within the scope of the present invention. The die pad region 132 may be further oversized to accommodate a plurality of chip sizes. An IC device manufacturer, for example, may further compensate for the difference between the size of a chip (not shown) and the size of the die pad region 132 by adjusting a length of the wire bonds (not shown) extending between a chip's bond pads (not shown) and the tips 134 of the internal leads 124. The die pad 130 may be further down-set from the rest of the lead frame base 100 in order to receive the IC chip (not shown), wherein, for example, each of the tie bar portions 128 may be bent to make a surface (not shown) of the IC chip generally reside in the same plane as the rest of the lead frame base.

Figure 3:
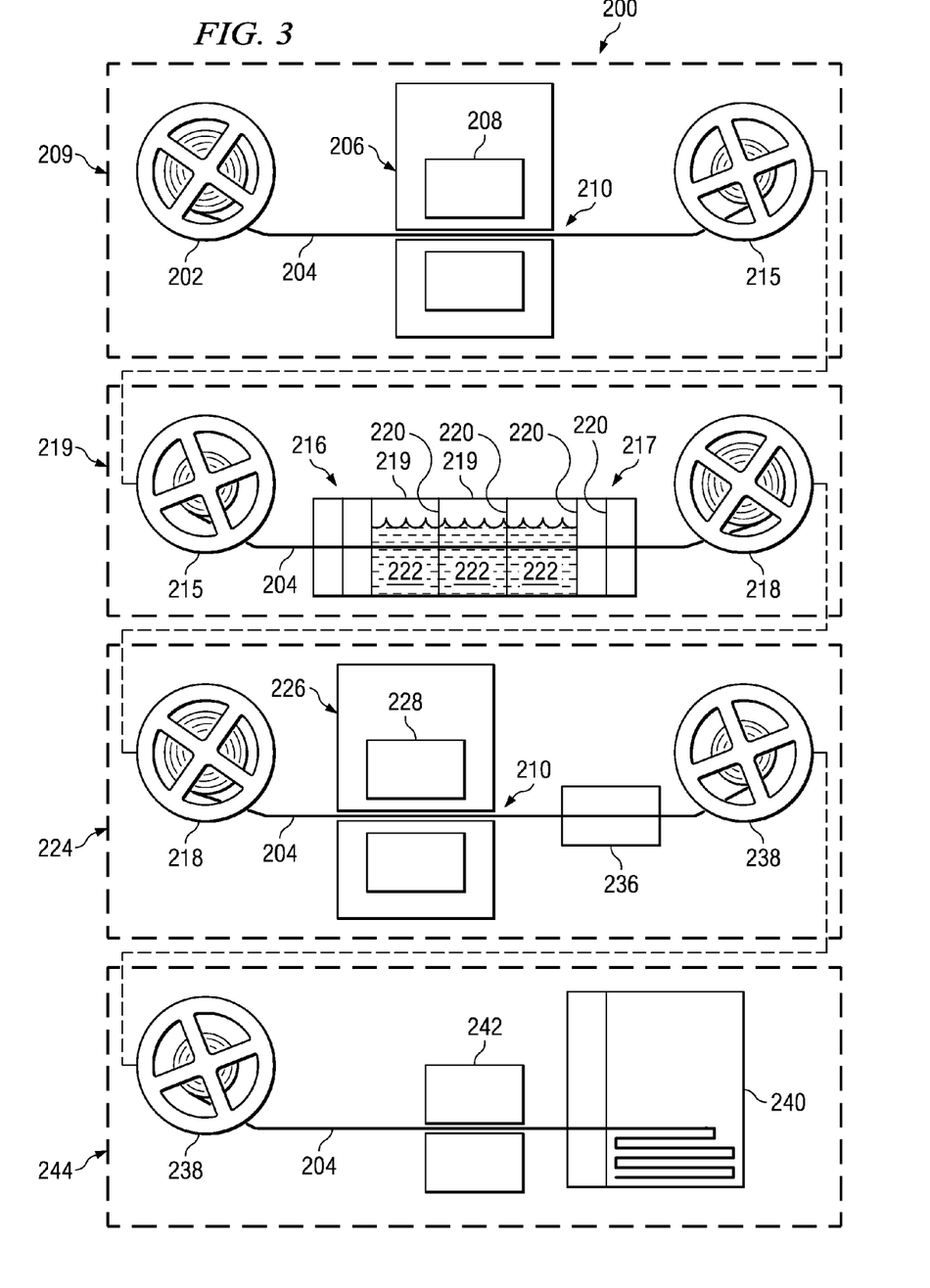
FIG. 3 is a schematic representation of an exemplary system for forming a lead frame base according to another aspect of the present invention.

Referring now to FIG. 3, another exemplary aspect of the invention is presented, wherein a system 200 for forming the lead frame 100 of FIG. 2 is provided. The system 200 of FIG. 3, for example, comprises a first coil 202 (e.g., a first reel) of contiguous metal sheeting 204, such as a roll of sheet copper. The contiguous metal sheeting 204, for example, comprises a plurality of the sheets 104 of base material 102 of FIG. 2, wherein the plurality of sheets are generally unrolled from first coil 202 and generally define the contiguous metal sheeting. A length of the contiguous metal sheeting 204 that can be unrolled from the first coil 202 of FIG. 3, for example, can range from 1000 to 5000 feet or more. Accordingly, a plurality of lead frame bases 100 of FIG. 2 may be formed from the contiguous metal sheeting 204 of FIG. 3, wherein each sheet 104 is operable to be generally indexed through an external lead stamping apparatus 206. The external lead stamping apparatus 206, for example, comprises a high speed first press and progressive stamping tool 208 located in a first location 209, wherein the external lead stamping apparatus is operable to form a plurality of lead frame blanks 210. The lead frame blanks 210, for example, comprise the carrier rails 208, cross rails 112, one or more index holes 114, a plurality of external leads 122, and dam bar 126 associated with the external lead frame portion 116 of FIG. 2, however, the internal leads 124, tie bar portions 128, and die pad 130 associated with the internal lead frame portion 118 have not yet been formed.

Figure 4:
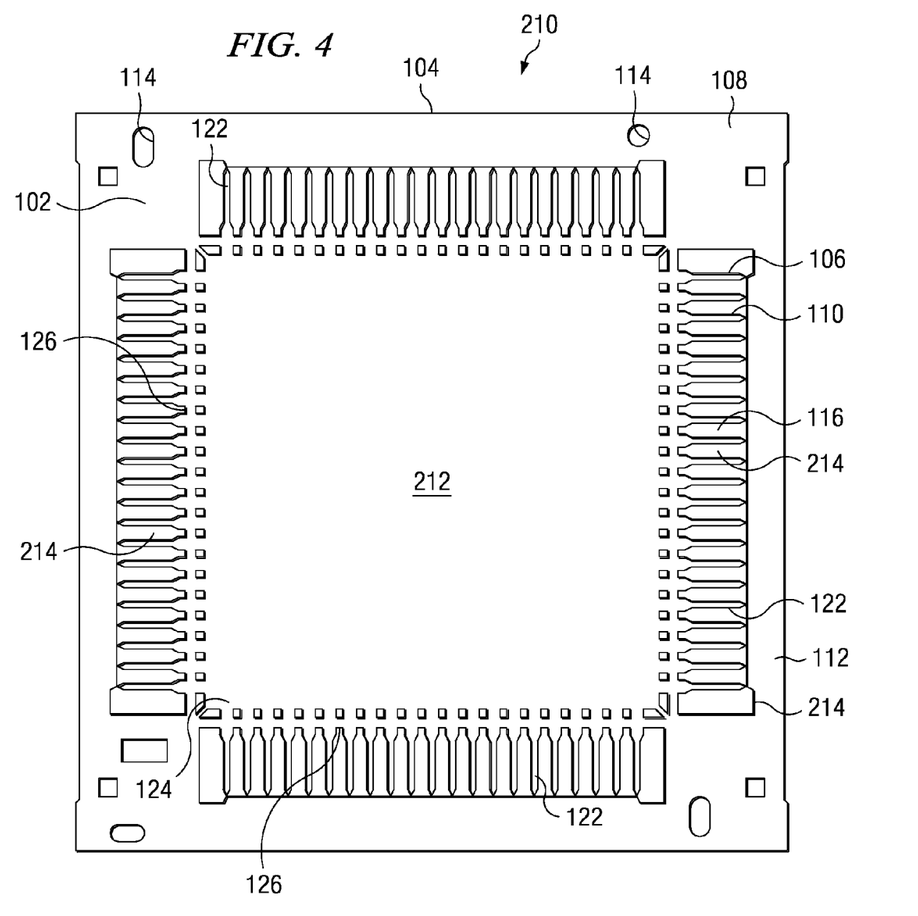
FIG. 4 is a plan view of an exemplary lead frame blank having a plurality of external leads and a blank portion according to another aspect of the present invention.
Figure 5:
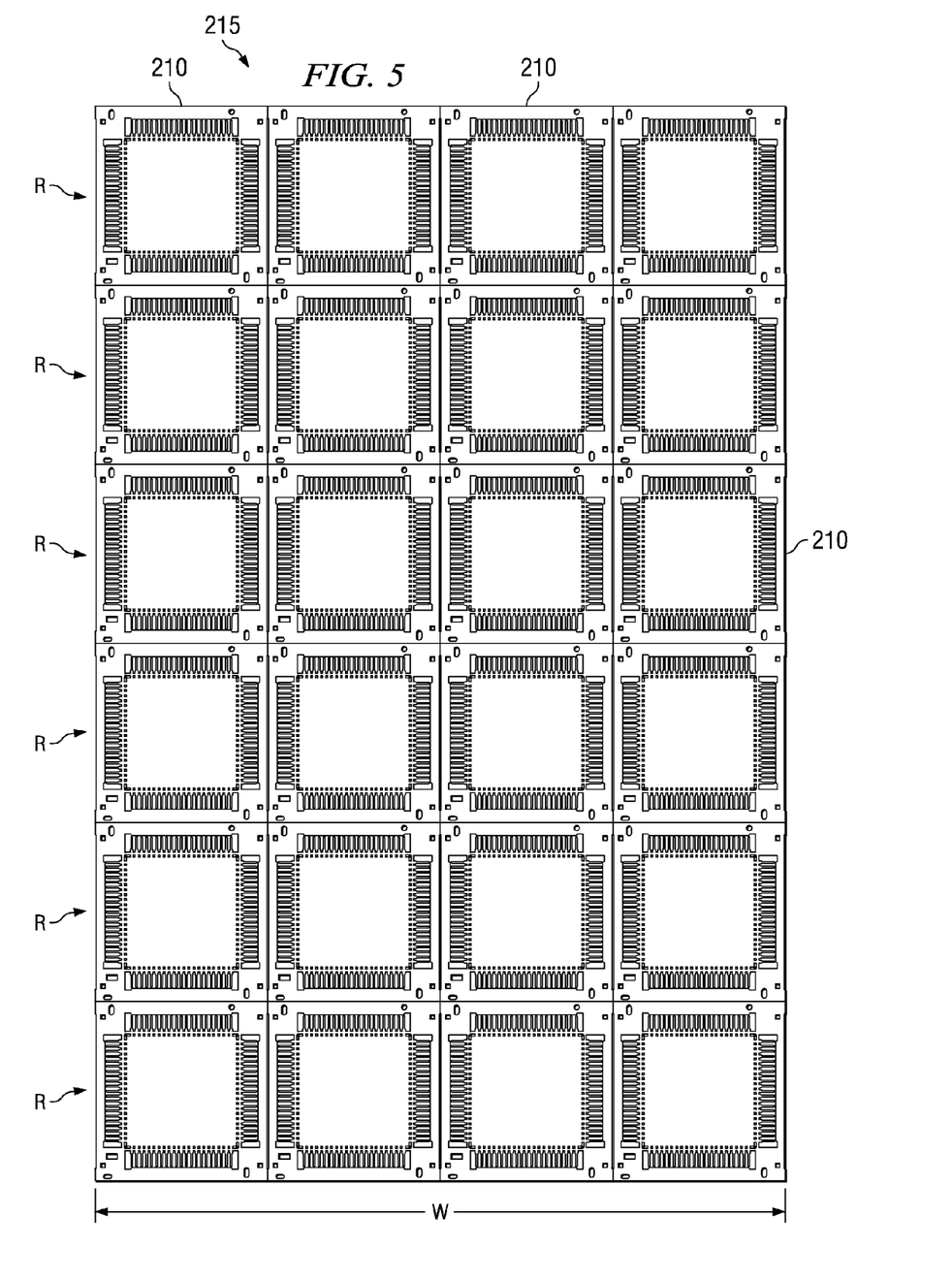
FIG. 5 is a plan view of an exemplary sheet of lead frame blanks according to still another aspect of the invention.

FIG. 4 illustrates an exemplary lead frame blank 210 formed by the external lead stamping apparatus 206 of FIG. 3 (e.g., the first press and progressive stamping tool 208), wherein the carrier rails 108, cross rails 112, one or more index holes 114, plurality of external leads 122, and dam bar 126 associated with the external lead frame portion 116 of FIG. 2 have been formed. A blank portion 212 of the lead frame blank 210 of FIG. 4 is further generally defined by the external lead stamping apparatus 206 of FIG. 3, wherein the internal leads 124, tie bar portions 128, and die pad 130 of FIG. 2 are generally not defined by the external lead stamping apparatus. Thus, the external lead stamping apparatus 206 of FIG. 3 comprises a plurality of external lead punches (not shown) operable to form the structures 106 associated with the external lead frame portion 116 of FIGS. 2 and 4, wherein the plurality of external punches can be quite large to form the relatively large structures (and gaps 214 therebetween) associated with the external lead frame portion of the lead frame blank 210. The external lead stamping apparatus 206 of FIG. 3 may then produce copies of the lead frame blank 210 by indexing the contiguous metal sheeting 204 through the external lead stamping apparatus (e.g., via the index holes 114 of FIG. 2). Furthermore, the system 200 of FIG. 3 is operable to form a matrix 215 of lead frame blanks 210, as illustrated in FIG. 5. The matrix 215, for example, can be any number of lead frame blanks 210 wide, up to a width W of the contiguous metal sheeting 204, wherein each row R of lead fame blanks 210 is indexed and respectively stamped in the external lead stamping apparatus 206 of FIG. 3.

Since the structures 106 of the lead frame blank 210 have generally large dimensions (e.g., with respect to the internal leads 124 of FIG. 2), the lead frame blank can be manufactured in a low-cost region (e.g., the first location 209), where labor and/or equipment costs are generally low. For example, since the structural dimensions of the lead frame blanks 210 are relatively large, the punches (not shown) of the external lead stamping apparatus 206 of FIG. 3 can be made to be quite robust. Thus, a lesser degree of expertise to maintain and operate the external lead stamping apparatus is needed.

According to another exemplary aspect of the present invention, once the lead frame blank 210 is formed in the external lead stamping apparatus 206, the lead frame blank may be plated with highly conductive plating metal(s), such as one or more of tin, tin/bismuth alloy, gold, palladium, and nickel. For example, the contiguous metal sheeting 204 (comprising the lead frame blank 210) is plated with nickel-palladium-gold (NiPdAu).

In one example, as illustrated in FIG. 3, the contiguous metal sheeting 204 is taken up on a second coil 215 (e.g., a second reel) after exiting the external lead stamping apparatus 206. The second coil 215, for example, can then be transported to a second location 219 and uncoiled into a plating apparatus 216, wherein all surfaces of the contiguous metal sheeting, and thus, all surfaces of the lead frame blanks 210, are generally plated with the plating metal(s). The plating apparatus 216, for example, comprises a plurality of stations 217 operable to perform a variety of processes, such as cleaning of the contiguous metal sheeting 204, activation processes, one or more metal plating processes, as well as rinse and dry processes, as will be understood by one of ordinary skill in the art. In the present example, once the contiguous metal sheeting 204 is plated in the plating apparatus 216, it is then taken up onto a third coil 218 (e.g., a third reel) for storage or transport to a third location 224.

It should be noted that the external lead stamping apparatus 206 requires approximately half the number of punches of a conventional stamping apparatus that punches both external and internal leads. Therefore, the external lead stamping apparatus 206 can be significantly smaller than conventional stamping apparatuses. Further, since the external lead stamping apparatus 206 does not have as many intricate and delicate smaller punches needed to stamp the internal leads, the external lead stamping apparatus is more robust and can operate for a longer period of time between required maintenance. It should be further noted that the external lead stamping apparatus 206 is significantly cheaper than conventional progressive stamping tools of the prior art, since the external lead stamping apparatus does not have as many punches and is significantly smaller than the conventional tool.

Still further, by stamping only the external leads prior to plating, a speed of the contiguous metal sheeting 204 through the plating apparatus 216 can be significantly increased over conventional plating speeds, due, at least in part, to the blank portion 212 of FIG. 4 being a substantially large, flat surface. The absence of the internal leads 124 of FIG. 2, for example, generally decreases drag-out (chemical carry over from contiguous plating baths) from the plating apparatus 216 of FIG. 3, wherein one or more air knives 220 can be further used to blow off plating solution 222 from the lead frame blanks 210.

Once the contiguous metal sheeting 204 (comprising the lead frame blanks 210) has been rolled onto the third coil 218, the third coil can be transported to the third location 224, such as a location proximate to an end user of the plurality of lead frames. For example, the third location 224 may be located in a higher-cost region having higher skilled and higher cost labor than the first location 209 and second location 219. At the third location 224, the third coil 218 is fed into an internal lead stamping apparatus 226, thus providing the contiguous metal sheeting 204 (comprising the lead frame blanks 210) to the internal lead stamping apparatus. The internal lead stamping apparatus 226, for example, is operable to form the internal leads 124, tie bar portions 128, and die pad 130 associated with the internal lead frame portion 118 of FIG. 2.

Figure 6:
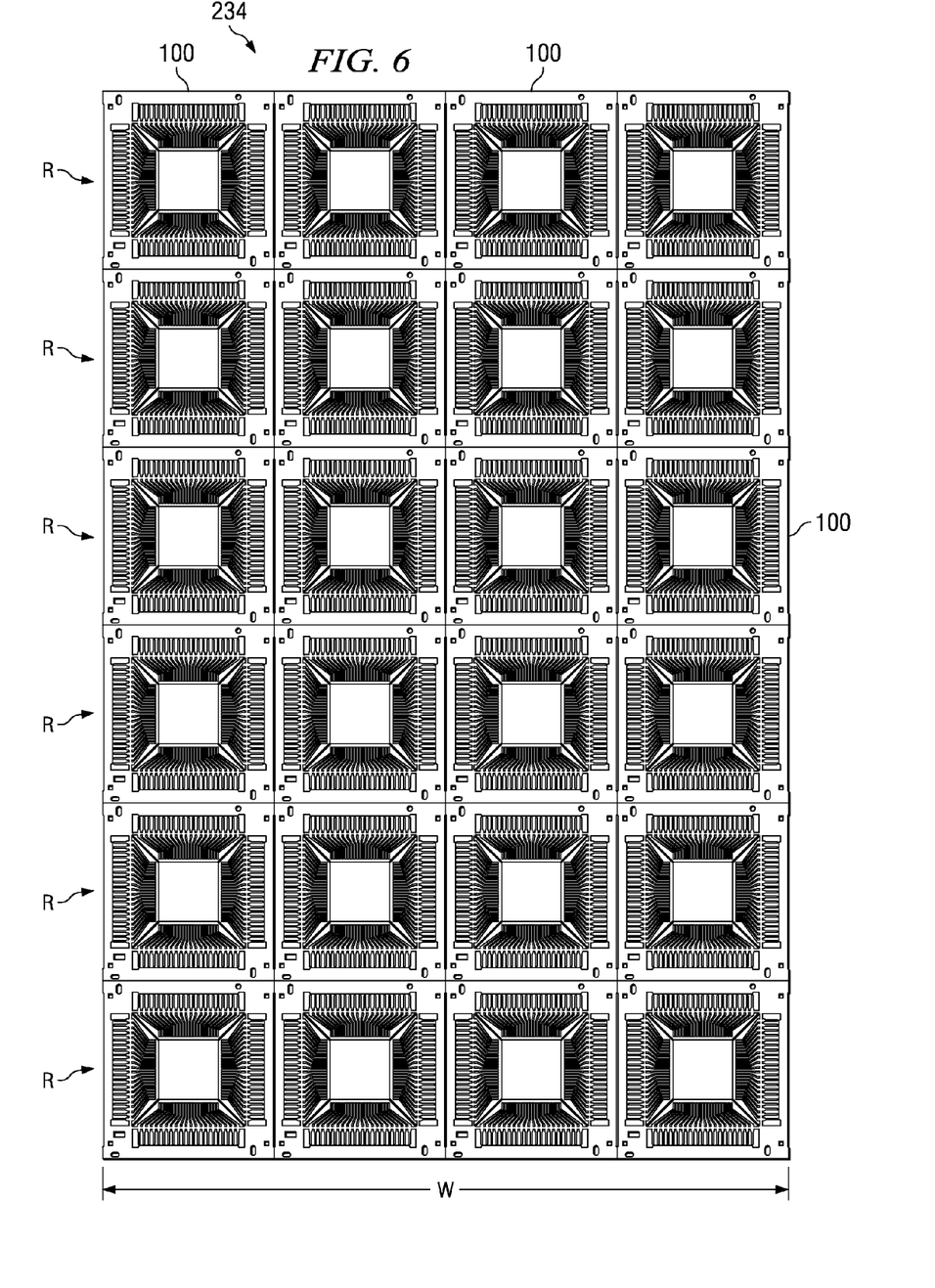
FIG. 6 is a plan view of a sheet of lead frame bases according to yet another exemplary aspect of the present invention.

Accordingly, the plurality of lead frame blanks 210 of FIG. 3 are indexed through the internal lead stamping apparatus 226 (e.g., via the index holes 114 of FIG. 2), wherein the plurality of lead frames 100 are consequently formed in the contiguous metal sheeting 204. The internal lead stamping apparatus 226, for example, may comprise another high speed progressive stamping tool 228, wherein the internal lead stamping apparatus comprises a plurality of intricate punches (not shown) operable to form the plurality of internal leads 124, tie bar portions 128, and die pad 130 of FIG. 2 from the lead frame blanks 210 of FIG. 4. The system 200 of FIG. 3, for example, is therefore operable to form a finished lead frame matrix 234 of lead frames 100, as illustrated in FIG. 6, wherein the lead frames are formed from the lead frame blanks 210 of FIG. 5.

The contiguous metal sheeting 204 is subsequently cleaned of stamping lubricants at a cleaning station 236 and taken up onto a fourth coil 238 (e.g., a fourth reel). A separator sheet (not shown) such as interleaving paper may be further rolled onto one or more of the second coil 215, the third coil 218, and the fourth coil 238 along with the contiguous metal sheeting 204 in order to avoid damage to the lead frames 100. The contiguous metal sheeting 204 may then be cut into individual sheets 240 by a cut and down-set apparatus 242 at a fourth location 244, wherein the fourth coil 238 is unwound and fed into the cut and down-set apparatus. The cut and down-set apparatus 242 may also offset the die pad 130 of FIG. 2 for accommodation of the IC chip (not shown). It should be further noted that the first location 209, second location 219, third location 224, and fourth location 244 can be geographically distant from one another.

The present invention realizes various advantages by stamping the internal leads 124 with the internal lead stamping apparatus 226 of FIG. 3 after the lead frame blanks 210 are plated. For example, depending on the number of leads in a particular design, since the lead frame blanks 210 comprise the generally solid blank portion 212, as illustrated in FIG. 4, a significant savings in plating material can be realized by not plating a thickness of each individual internal lead 124 of FIG. 2. For example, by plating the blank portion 212 prior to forming the internal leads, (e.g., generally plating a top and bottom surface of the blank portion prior to forming the internal leads), substantially less precious metal is plated onto the lead frame blanks 210 than in conventional processing, wherein a thickness of each of the conventional internal leads are also plated, thus plating a larger total surface area than the present invention. Furthermore, according to the present invention, since the internal leads of 124 of FIG. 2 are formed after plating, the top and bottom surfaces of each internal lead remains plated, whereas the unplated thickness of each internal lead is exposed due to the stamping of the internal leads after plating (e.g., a sidewall of each internal lead between the top and bottom surfaces is exposed by stamping—not shown). Such a "virgin" surface exposed by the stamping of the internal leads after plating not only reduces plating costs, as discussed above, but also, in the case of Cu alloys, provides superior mold compound adhesion upon encapsulation of the IC chip. Furthermore, as stated above, the lead frame blanks 210 of FIG. 4 can be formed in a low-cost region, wherein labor and materials costs are small, compared to potentially higher-cost regions where internal leads are formed.

Figure 7:
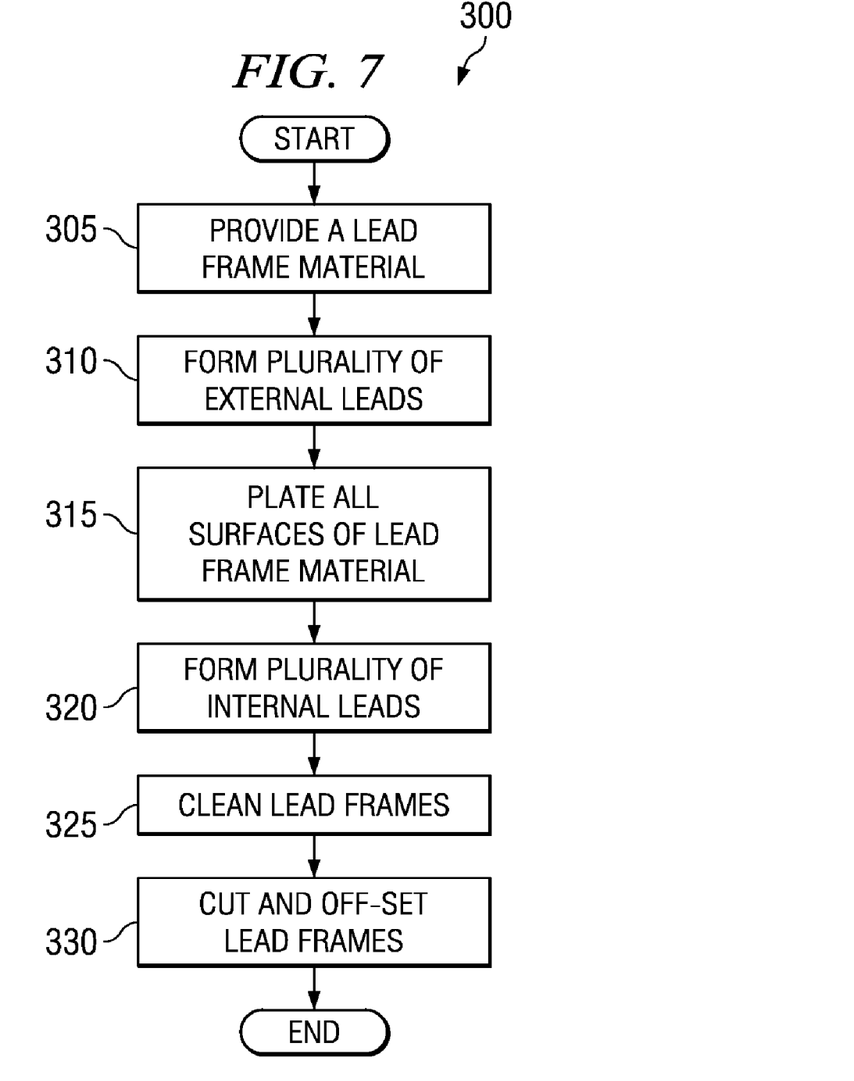
FIG. 7 is a block diagram schematic of an exemplary method for fabricating a lead frame base in accordance with the present invention.

According to another aspect of the present invention, FIG. 7 is a block diagram illustrating an exemplary method 300 for fabricating a lead frame. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 7, the method 300 begins with act 305, wherein a lead frame material is provided. The lead frame material, for example, comprises the contiguous metal sheeting 204 of FIG. 3, such as a sheet of copper rolled in a first coil 202. In act 310 of FIG. 7, a plurality of external leads are formed in the lead frame material. For example, the formation of the plurality of external leads, for example, comprises the formation of the carrier rails 108, index holes 114, and the external leads 122 of FIG. 2, as well as the blank portion 212 of FIG. 4 in the external lead stamping apparatus 206 of FIG. 3.

In act 315 of FIG. 7, a metal or metals are plated on all surfaces of the lead frame material after the external leads are formed. For example, after the external leads are formed in act 310, the contiguous metal sheeting 204 of FIG. 3 may then be rolled onto the second coil 215 for transportation to the plating apparatus 216. Alternatively, the contiguous metal sheeting 204 may be fed from the external lead stamping apparatus 206 directly to the plating apparatus 216. Thus, in act 315 of FIG. 7, all surfaces of the external leads 122 and blank portion 212 of FIG. 4 are plated with the metal or metals. After act 310 or act 315, the lead frame material can be rolled onto a third coil 218, as illustrated in FIG. 3, for transportation or storage.

In act 320 of FIG. 7, a plurality of internal leads are formed in the lead frame material, such as by the internal lead stamping apparatus of FIG. 3. It is key that the formation of the plurality of internal leads occurs after the plating of act 315. As a consequence, the formation of the internal leads and external leads can take place in different geographical locations, wherein the third coil 218 of FIG. 3 can be transported between the geographical locations. Furthermore, according to another example, the third coil 218 comprises the plurality of lead frame blanks 210, as illustrated in FIGS. 4 and 5, wherein the same lead frame blanks can be utilized for a variety of internal lead frame configurations. According to one alternative aspect of the invention, the unplated lead frame blanks 210 can be further used to directly feed an etch operation to form the internal leads wherein plating takes place after the lead frame is fully formed.

After the internal leads are stamped, the lead frame is cleaned of stamping oils/lubricants in act 325. The die pad of each lead frame may then be down-set and the continuous metal sheet is cut to lengths in act 330, wherein the lengths comprising the lead frames are suitable for use by the end user, such as those used in an assembly or testing operation.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A lead frame comprising:
   external leads with top, bottom and sidewall surfaces;
   internal leads connected to the external leads, with top, bottom, and sidewall surfaces;
   a metallic material covering the top, bottom, and sidewall surfaces of the external leads;
   the metallic material covering the top and bottom surfaces of the internal leads;
   the sidewall surfaces of the internal leads free of the metallic material; and
   a die pad adjacent the internal leads.

2. The lead frame of claim 1, further comprising copper.

3. The lead frame of claim 1, in which the metallic material comprises nickel.

4. The lead frame of claim 1, in which the metallic material comprises gold.

5. The lead frame of claim 1, in which the metallic material comprises palladium.

6. The lead frame of claim 1, in which the die pad has a top, bottom and sidewall surfaces.

7. The die pad of claim 6, in which the metallic material covers the top and the bottom surface, and uncovers the sidewall surfaces.

8. The die pad of claim 1, further connected to tie bars having a top, bottom and sidewall surfaces.

9. The tie bars of claim 8, in which the metallic material covers the top and the bottom surface, and uncovers the sidewall surfaces.

10. A semiconductor device comprising:
    a lead frame including:
      external leads with top, bottom and sidewall surfaces;
      internal leads connected to the external leads, with top, bottom, and sidewall surfaces;
      a metallic material covering the top, bottom, and sidewall surfaces of the external leads;
      the metallic material covering the top and bottom surfaces of the internal leads;
      the sidewall surfaces of the internal leads free of the metallic material; and
      a die pad adjacent the internal leads; and
    an IC chip attached to the die pad.

11. The semiconductor device of claim 10, in which the lead frame includes copper.

12. The semiconductor device of claim 10, in which the metallic material comprises nickel.

13. The semiconductor device of claim 10, in which the metallic material comprises gold.

14. The semiconductor device of claim 10, in which the metallic material comprises palladium.

15. The lead frame of claim 10, in which the die pad has a top, bottom and sidewall surfaces.

16. The semiconductor device of claim 15, in which the metallic material covers the top and the bottom surface, and uncovers the sidewall surfaces.

17. The die pad of claim 11, further connected to tie bars having a top, bottom and sidewall surfaces.

18. The tie bars of claim 17, in which the metallic material covers the top and the bottom surface, and uncovers the sidewall surfaces.

* * * * *